US011265977B2

(12) United States Patent
Hirochi et al.

(10) Patent No.: US 11,265,977 B2
(45) Date of Patent: Mar. 1, 2022

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yukitomo Hirochi, Toyama (JP); Yoshihiko Yanagisawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 426 days.

(21) Appl. No.: 16/280,458

(22) Filed: Feb. 20, 2019

(65) Prior Publication Data

US 2019/0182915 A1    Jun. 13, 2019

Related U.S. Application Data

(63) Continuation of application No. PCT/JP2016/075488, filed on Aug. 31, 2016.

(51) Int. Cl.
*H05B 6/80*     (2006.01)
*H05B 6/68*     (2006.01)
(Continued)

(52) U.S. Cl.
CPC .......... *H05B 6/806* (2013.01); *H01L 21/02* (2013.01); *H01L 21/268* (2013.01);
(Continued)

(58) Field of Classification Search
CPC . H01L 21/02; H01L 21/268; H01L 21/67115; H01L 21/67248; H05B 6/68; H05B 6/806
(Continued)

(56) References Cited

U.S. PATENT DOCUMENTS

2014/0073065 A1    3/2014  Ohno et al.
2015/0289324 A1*  10/2015  Rober ...................... H05B 6/68
                                                                  219/711
2018/0211840 A1*   7/2018  Yamaguchi ........... H01L 21/324

FOREIGN PATENT DOCUMENTS

JP    61-043417 A    3/1986
JP    2014-035862 A  2/2014
(Continued)

OTHER PUBLICATIONS

International Search Report, PCT/JP2016/075488, dated Nov. 22, 2016, 2 pgs.
(Continued)

*Primary Examiner* — Quang T Van
(74) *Attorney, Agent, or Firm* — Volpe Koenig

(57) ABSTRACT

A process chamber configured to process at least one substrate; at least one heating device to heat the at least one substrate using an electromagnetic wave; a non-contact type temperature measurement device configured to measure a temperature of the at least one substrate; and a controller configured to acquire temperature data measured by the temperature measurement device, compare the measured temperature with a preset upper limit temperature and a preset lower limit temperature, lower an output of the at least one heating device or turn off a power supply of the at least one heating device when the measured temperature from the temperature data is higher than the upper limit temperature, and lower an output of the at least one heating device or turn off a power supply of the at least one heating device when the measured temperature from the temperature data is lower than the lower limit temperature.

11 Claims, 6 Drawing Sheets

(51) Int. Cl.
  *H01L 21/67*  (2006.01)
  *H01L 21/268*  (2006.01)
  *H01L 21/02*  (2006.01)

(52) U.S. Cl.
  CPC .. *H01L 21/67115* (2013.01); *H01L 21/67248* (2013.01); *H05B 6/68* (2013.01)

(58) Field of Classification Search
  USPC ....... 219/678, 686, 690, 695, 710, 753, 754, 219/757; 422/109, 288, 300, 307; 427/757, 532, 569, 575; 156/33, 435
  See application file for complete search history.

(56) References Cited

FOREIGN PATENT DOCUMENTS

| | | |
|---|---|---|
| JP | 2014-056927 A | 3/2014 |
| JP | 2015-070045 A | 4/2015 |
| JP | 2015-103726 A | 6/2015 |

OTHER PUBLICATIONS

Korean Office Action dated Aug. 14, 2020 for Korean Patent Application No. 10-2019-7004814.

* cited by examiner

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2016/075488, filed on Aug. 31, 2016, the disclosure of which is incorporated herein in its entirety by reference.

TECHNICAL FIELD

The present disclosure relates to a substrate processing apparatus, a method of manufacturing a semiconductor device, and a recording medium.

BACKGROUND

As one of the processes of manufacturing a semiconductor device, there is available, for example, a modifying process represented by an annealing process for heating a substrate in a process chamber with the use of a heating device to change the composition or crystal structure in a thin film formed on a surface of the substrate or to restore a crystal defect or the like in the formed thin film. In recent semiconductor devices, miniaturization and high integration have become remarkable. Accordingly, it is required to perform a modifying process to a high-density substrate on which a pattern having a high aspect ratio is formed. As a method for modifying such a high-density substrate, for example, a heat treatment method using a microwave has been studied.

In a heat treatment using a microwave of the related art, there may be a case where a substrate may not be uniformly heated due to the substrate being deformed during the heat treatment.

SUMMARY

Some embodiments of the present disclosure provide an electromagnetic wave heat treatment technique capable of suppressing deformation or damage of a substrate.

According to some embodiments of the present disclosure, there is provided a technique that includes: a process chamber in which at least one substrate is processed; at least one heating device configured to heat the at least one substrate using an electromagnetic wave; a non-contact type temperature measurement device configured to measure a temperature of the at least one substrate; and a controller configured to perform control so as to acquire temperature data measured by the temperature measurement device, compare the measured temperature from the temperature data with a preset upper limit temperature and a preset lower limit temperature, lower an output of the at least one heating device or turn off a power supply of the at least one heating device when the measured temperature from the temperature data is higher than the upper limit temperature, and lower an output of the at least one heating device or turn off a power supply of the at least one heating device when the measured temperature from the temperature data is lower than the lower limit temperature.

DETAILED DESCRIPTION

Figure 1:
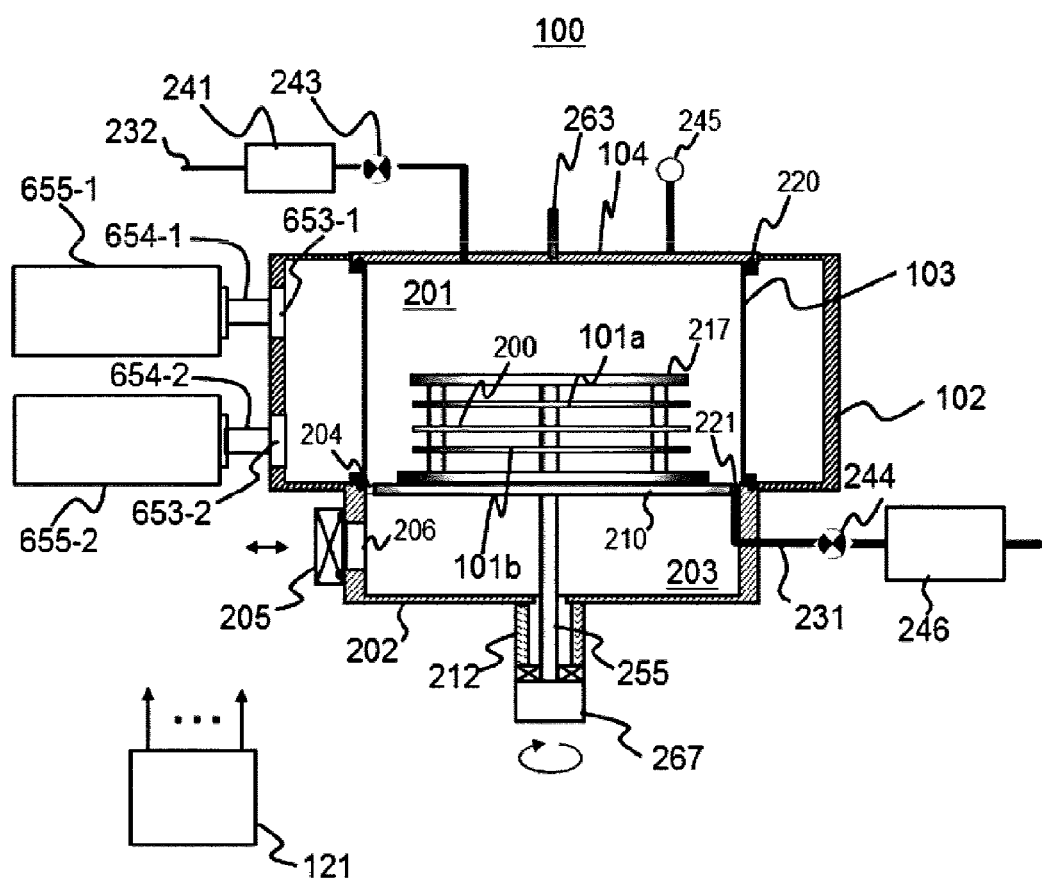
FIG. 1 is a schematic configuration diagram of a single-wafer-type process furnace of a substrate processing apparatus suitably used in a first embodiment of the present disclosure, and a process furnace portion is shown in a vertical sectional view.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment of Present Disclosure

Hereinafter, a first embodiment of the present disclosure will be described with reference to the drawings.

(1) Configuration of Substrate Processing Apparatus

In the present embodiment, the substrate processing apparatus 100 according to the present disclosure is configured as a single-wafer-type heat treatment apparatus for performing various heat treatments on a wafer. In the present embodiment, the substrate processing apparatus 100 will be described as an apparatus that performs an annealing process (modifying process) using an electromagnetic wave to be described later.

(Process Chamber)

As shown in FIG. 1, the substrate processing apparatus 100 according to the present embodiment includes a case 102 as a cavity (upper container) made of an electromagnetic-wave-reflecting material such as a metal or the like, and a cylindrical reaction tube 103 accommodated inside the case 102 with vertical upper and lower end portions thereof opened. The reaction tube 103 is made of an electromagnetic-wave-transmitting material such as quartz or the like. A cap flange (closing plate) 104 made of a metallic material is brought into contact with an upper end of the reaction tube 103 via an O-ring 220 as a sealing member to close the upper end of the reaction tube 103. A process container for processing a substrate such as a silicon wafer or the like is mainly constituted by the case 102, the reaction tube 103 and the cap flange 104. In particular, an internal space of the reaction tube 103 is configured as a process chamber 201. The process container may be constituted by the case 102 and the cap flange 104 without installing the reaction tube 103. In that case, the internal space of the case 102 becomes the process chamber 201. In addition, without installing the cap flange 104 and by using a case 102 having a closed ceiling, the process container may be constituted by the case 102 and the reaction tube 103, or may be constituted by the case 102.

A mounting stand 210 is installed below the reaction tube 103, and a boat 217 as a substrate holder for holding a wafer 200 as a substrate is mounted on an upper surface of the mounting stand 210. In the boat 217, a wafer 200 to be processed and quartz plates 101a and 101b as heat insulating plates placed vertically above and below the wafer 200 so as to sandwich the wafer 200 are held at predetermined intervals. Instead of the quartz plates 101a and 101b, it may be possible to mount components having a function as susceptors (also referred to as radiation plates or thermo-uniformity plates) (not shown), for example, silicon plates (Si plates), silicon carbide plates (SiC plates) or the like, which are made of a material such as a dielectric material or the like that is self-heated by absorbing an electromagnetic wave and which are configured to indirectly heat the wafer 200. Furthermore, the susceptors may be mounted on an outer side of the wafer 200 and on inner sides of the quartz plate 101a and 101b. That is, the wafer 200 may be sandwiched by the susceptors, and the susceptors may be sandwiched between the quartz plates 101a and 101b (may be disposed between the wafer 200 and the quartz plate 101a and between the wafer 200 and the quartz plate 101b). By configuring in this manner, it is possible to more efficiently and uniformly heat the wafer 200. In the present embodiment, the quartz plates 101a and 101b are the same component and will be referred to as a quartz plate 101 hereinafter unless there is a need to specifically distinguish them from each other.

In the side wall of the mounting stand 210, a protrusion portion (not shown) protruding in a radial direction of the mounting stand 210 is installed on the side of a bottom surface of the mounting stand 210. This protrusion portion comes close to or makes contact with a partition plate 204 installed between the process chamber 201 and a transfer space 203 to be described later, thereby preventing the atmosphere in the process chamber 201 from moving into the transfer space 203 or preventing the atmosphere in the transfer space 203 from moving into the process chamber 201.

The case 102 as an upper container has, for example, a circular cross section, and is configured as a flat closed container. Further, a transfer container 202 as a lower container is made of a metallic material such as aluminum (Al), stainless steel (SUS) or the like, quartz, or the like. A transfer area 203 for transferring a wafer 200 such as a silicon wafer or the like is formed under the process container. A space surrounded by the case 102 or a space surrounded by the reaction tube 103 and located above the partition plate 204 is sometimes referred to as a process chamber 201 or a reaction area 201 as a process space. A space surrounded by the transfer container 202 and located below the partition plate 204 is sometimes referred to as a transfer area 203 as a transfer space. The process chamber 201 and the transfer area 203 are not limited to being vertically adjacent to each other as in the present embodiment, but may be configured to be adjacent to each other in the horizontal direction. Alternatively, only the process chamber 201 may be installed without installing the transfer area 203.

A substrate loading/unloading port 206 adjacent to a gate valve 205 is installed on a side surface of the transfer container 202. The wafer 200 moves to and from a substrate transfer chamber (not shown) via the substrate loading/unloading port 206.

An electromagnetic wave supply part as a heating device, which will be described in detail later, is installed on the side surface of the case 102. An electromagnetic wave such as a microwave or the like supplied from the electromagnetic wave supply part is introduced into the process chamber 201 to heat the wafer 200 and the like, thereby processing the wafer 200.

The mounting stand 210 is supported by a shaft 255 as a rotating shaft. The shaft 255 penetrates the bottom portion of the transfer container 202. Furthermore, the shaft 255 is connected to a drive mechanism 267 that performs a rotating or elevating operation outside the transfer container 202. By driving the drive mechanism 267 to rotate or elevate the shaft 255 and the mounting stand 210, it is possible to rotate or elevate the wafer 200 placed on the boat 217. A periphery of a lower end portion of the shaft 255 is covered by a bellows 212, whereby an inside of the process chamber 201 and the transfer area 203 are kept airtight.

At the time of transferring the wafer 200, the mounting stand 210 is lowered such that an upper surface of the mounting stand 210 is located at a position (wafer transfer position) corresponding to the substrate loading/unloading port 206. At the time of processing the wafer 200, as shown in FIG. 1, the wafer 200 is raised to the processing position (wafer processing position) in the process chamber 201. When the process chamber 201 and the transfer area 203 are configured to be adjacent to each other in the horizontal direction as described above, or when only the process chamber 201 is installed without installing the transfer area 203, only a mechanism for rotating the mounting stand may be installed without installing a mechanism for raising and lowering the mounting stand.

(Exhaust Part)

An exhaust part for exhausting an atmosphere in the process chamber 201 is installed below the process chamber 201 and on the outer peripheral side of the mounting stand 210. As shown in FIG. 1, an exhaust port 221 is formed in the exhaust part. An exhaust pipe 231 is connected to the exhaust port 221. A pressure regulator 244 such as an APC valve or the like for controlling a valve opening degree depends on a pressure in the process chamber 201, and a vacuum pump 246 are sequentially and serially connected to the exhaust pipe 231. In this regard, the pressure regulator 244 is not limited to the APC valve as long as it can receive the pressure information (the feedback signal from a pressure sensor 245 to be described later) in the process chamber 201 and can adjust an exhaust amount. The pressure regulator 244 may be configured so as to use an ordinary opening/closing valve and a pressure regulation valve in combination.

An exhaust part (also referred to as an exhaust system or an exhaust line) is mainly constituted by the exhaust port 221, the exhaust pipe 231 and the pressure regulator 244. An exhaust port may be installed to surround the mounting stand 210 so that the gas can be exhausted from an entire periphery of the wafer 200. In addition, the vacuum pump 246 may be added to the configuration of the exhaust part.

(Gas Supply Part)

In the cap flange 104, there is installed a gas supply pipe 232 for supplying processing gases for various substrate processing processes such as an inert gas, a precursor gas, a reaction gas and the like into the process chamber 201. In the gas supply pipe 232, a mass flow controller (MFC) 241 which is a flow rate controller (flow rate control part) and a valve 243 which is an opening/closing valve are installed sequentially from the upstream side. For example, a nitrogen ($N_2$) gas source for supplying a nitrogen ($N_2$) gas as an inert gas is connected to the upstream side of the gas supply pipe 232. The nitrogen ($N_2$) gas is supplied into the process chamber 201 via the MFC 241 and the valve 243. In the case of using plural kinds of gases at the time of substrate processing, the plural kinds of gases can be supplied by using a configuration in which a gas supply pipe having an MFC as a flow rate controller and a valve as an opening/closing valve installed sequentially from the upstream side is connected to the gas supply pipe 232 on the downstream side of the valve 243. A gas supply pipe provided with an MFC and a valve may be installed for each type of gas.

A gas supply system (gas supply part) is mainly constituted by the gas supply pipe 232, the MFC 241 and the valve 243. When an inert gas is supplied to the gas supply system, the gas supply system is also referred to as an inert gas supply system. As the inert gas, in addition to the $N_2$ gas, it may be possible to use, for example, a rare gas such as an Ar gas, a He gas, a Ne gas, a Xe gas or the like.

(Temperature Sensor)

In the cap flange 104, there is installed a temperature sensor 263 as a non-contact type temperature measurement device. By adjusting an output of a microwave oscillator 655 to be described below on the basis of the temperature information detected by the temperature sensor 263, it is possible to heat the substrate so that a substrate temperature has a desired temperature distribution. The temperature sensor 263 is constituted by, for example, a radiation thermometer such as an IR (Infrared Radiation) sensor or the like. The temperature sensor 263 is installed so as to measure a surface temperature of a quartz plate 101a or a surface temperature of the wafer 200. In the case where the aforementioned susceptor as a heating element is installed, the temperature sensor 263 may be configured to measure a surface temperature of the susceptor. When the temperature of the wafer 200 (wafer temperature) is referred to in the present disclosure, it may mean a wafer temperature converted by temperature conversion data to be described below, i.e., an estimated wafer temperature, a temperature obtained by directly measuring the temperature of the wafer 200 with the temperature sensor 263, or both.

Figure 2A:
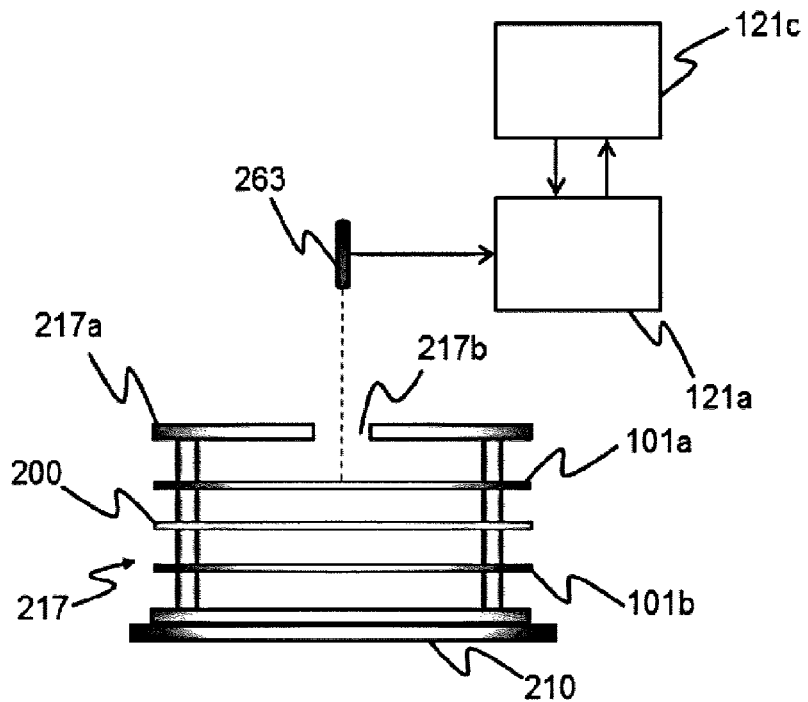
FIG. 2A is a view showing a temperature measurement method of the substrate processing apparatus suitably used in the first embodiment of the present disclosure, in which view there is shown a state at the time of measuring a temperature of a heat insulating plate.
Figure 2B:
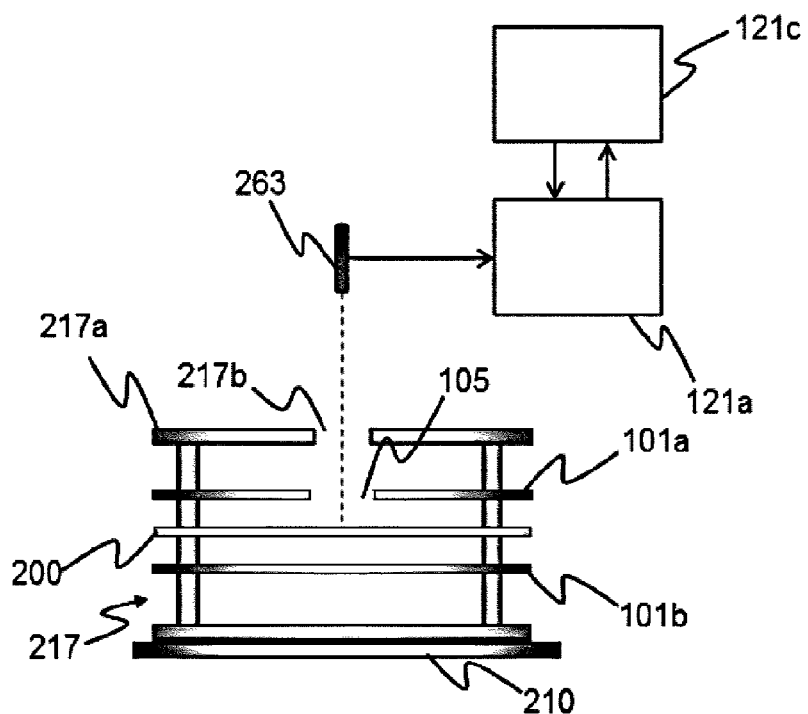
FIG. 2B is a view showing a temperature measurement method of the substrate processing apparatus suitably used in the first embodiment of the present disclosure, and a state at the time of measuring the temperature of a substrate is shown.

As shown in FIGS. 2A and 2B, when the surface temperature of the quartz plate 101a and the wafer 200 is measured using the temperature sensor 263, a measurement hole 217b as a temperature measurement window is formed at the position of a top plate 217a of the boat 217 facing the temperature sensor 263, so that the ceiling portion (top plate) 217a of the boat 217 does not hinder the temperature measurement. The surface temperature of the quartz plate 101a is measured through the measurement hole 217b. Also in the case of measuring the temperature of the wafer 200, a measurement hole 217b of the boat 217 is formed as in the measurement of the temperature of the quartz plate 101a, and a measurement hole 105 serving as a measurement window is formed in the quartz plate 101a, whereby the surface temperature of the wafer 200 is measured. In some embodiments, the temperature measurement of the quartz plate 101 and the wafer 200 may be performed at a preparatory stage before carrying out a substrate processing process, thereby previously acquiring a transition of a change in the temperature of the quartz plate 101 and the wafer 200 in the substrate processing process. By acquiring the transition of a change in the temperature of the quartz plate 101 and the wafer 200 in this manner, temperature conversion data indicating a correlation between the temperatures of the quartz plate 101 and the wafer 200 is stored in a memory device 121c or an external memory device 123. By preparing the temperature conversion data in advance as described above, the temperature of the wafer 200 can be estimated merely by measuring the temperature of the quartz plate 101. Based on the estimated temperature of the wafer 200, an output of a microwave oscillator 655, i.e., the heating device is controlled.

The means for measuring a temperature of a substrate is not limited to the above-described radiation thermometer. The temperature measurement may be performed by using a thermocouple or may be performed by using both the thermocouple and a non-contact type thermometer. However, when temperature measurement is performed using the thermocouple, it is necessary to arrange the thermocouple near the wafer 200 to perform temperature measurement. That is, it is necessary to arrange the thermocouple in the process chamber 201. Therefore, the thermocouple itself is heated by the microwave supplied from the microwave oscillator to be described below. This makes it impossible to accurately measure the temperature. Accordingly, a non-contact type thermometer may be used as the temperature sensor 263 in some embodiments. Further, the temperature sensor 263 is not limited to being installed on the cap flange 104, but may be installed on the mounting stand 210. Further, the temperature sensor 263 may not only be directly installed on the cap flange 104 or the mounting stand 210 but also be configured to indirectly measure the temperature by reflecting radiation light from a measurement window formed in the cap flange 104 or the mounting stand 210 through the use of a mirror or the like. In addition, the number of the installed temperature sensor 263 is not limited to one, but a plurality of temperature sensors may be installed.

(Electromagnetic Wave Supply Part)

Electromagnetic wave introduction ports 653-1 and 653-2 are installed on a side wall of the case 102. One end of each of waveguides 654-1 and 654-2 for supplying an electromagnetic wave into the process chamber 201 is connected to each of the electromagnetic wave introduction ports 653-1 and 653-2. Microwave oscillators (electromagnetic wave sources) 655-1 and 655-2 as heat sources for supplying an electromagnetic wave into the process chamber 201 to heat an interior of the process chamber 201 are connected to the other ends of the waveguides 654-1 and 654-2. Each of the microwave oscillators 655-1 and 655-2 supplies an electromagnetic wave such as a microwave or the like to the waveguides 654-1 and 654-2. As the microwave oscillators 655-1 and 655-2, a magnetron, a klystron or the like may be used. Hereinafter, the electromagnetic wave introduction ports 653-1 and 653-2, the waveguides 654-1 and 654-2 and the microwave oscillators 655-1 and 655-2 will be described as an electromagnetic wave introduction port 653, a waveguide 654 and a microwave oscillator 655, respectively, unless there is a particular need to distinguish them.

A frequency of the electromagnetic wave generated by the microwave oscillator 655 may be controlled so as to fall within a frequency range of from 13.56 MHz to 24.125 GHz in some embodiments. The frequency of the electromagnetic wave may be controlled to become a frequency of 2.45 GHz or 5.8 GHz in some embodiments. In this regard, the frequencies of the microwave oscillators 655-1 and 655-2 may be the same or may be different from each other. In the present embodiment, two microwave oscillators 655 are arranged on a side surface of the case 102. However, the present disclosure is not limited thereto and one or more microwave oscillators 655 may be installed. Further, the microwave oscillators 655 may be installed on different surfaces such as the opposing side surfaces of the case 102. An electromagnetic wave supply part (also referred to as an electromagnetic wave supply device, a microwave supply part, or a microwave supply device) as a heating device is mainly constituted by the microwave oscillators 655-1 and 655-2, the waveguides 654-1 and 654-2, and the electromagnetic wave introduction ports 653-1 and 653-2.

A controller 121 to be described below is connected to each of the microwave oscillators 655-1 and 655-2. The temperature sensor 263 for measuring the temperature of the quartz plate 101a or 101b or the wafer 200 contained in the process chamber 201 is connected to the controller 121. The temperature sensor 263 measures the temperature of the quartz plate 101 or the wafer 200 according to the above-described method and transmits the measured temperature to the controller 121. The controller 121 controls the output of the microwave oscillators 655-1 and 655-2, thereby controlling the heating of the wafer 200. As the method of controlling the heating performed by the heating device, it may be possible to use a method of controlling the heating of the wafer 200 by controlling the voltage inputted to the microwave oscillator 655, a method of controlling the heating of the wafer 200 by changing a ratio of a time to turn on the power supply of the microwave oscillator 655 and a time to turn off the power supply of the microwave oscillator 655, and the like.

In this regard, the microwave oscillators 655-1 and 655-2 are controlled by the same control signal transmitted from the controller 121. However, the present disclosure is not limited thereto. The microwave oscillators 655-1 and 655-2 may be respectively controlled by transmitting control signals from the controller 121 to the microwave oscillators 655-1 and 655-2 respectively.

(Control Device)

Figure 3:
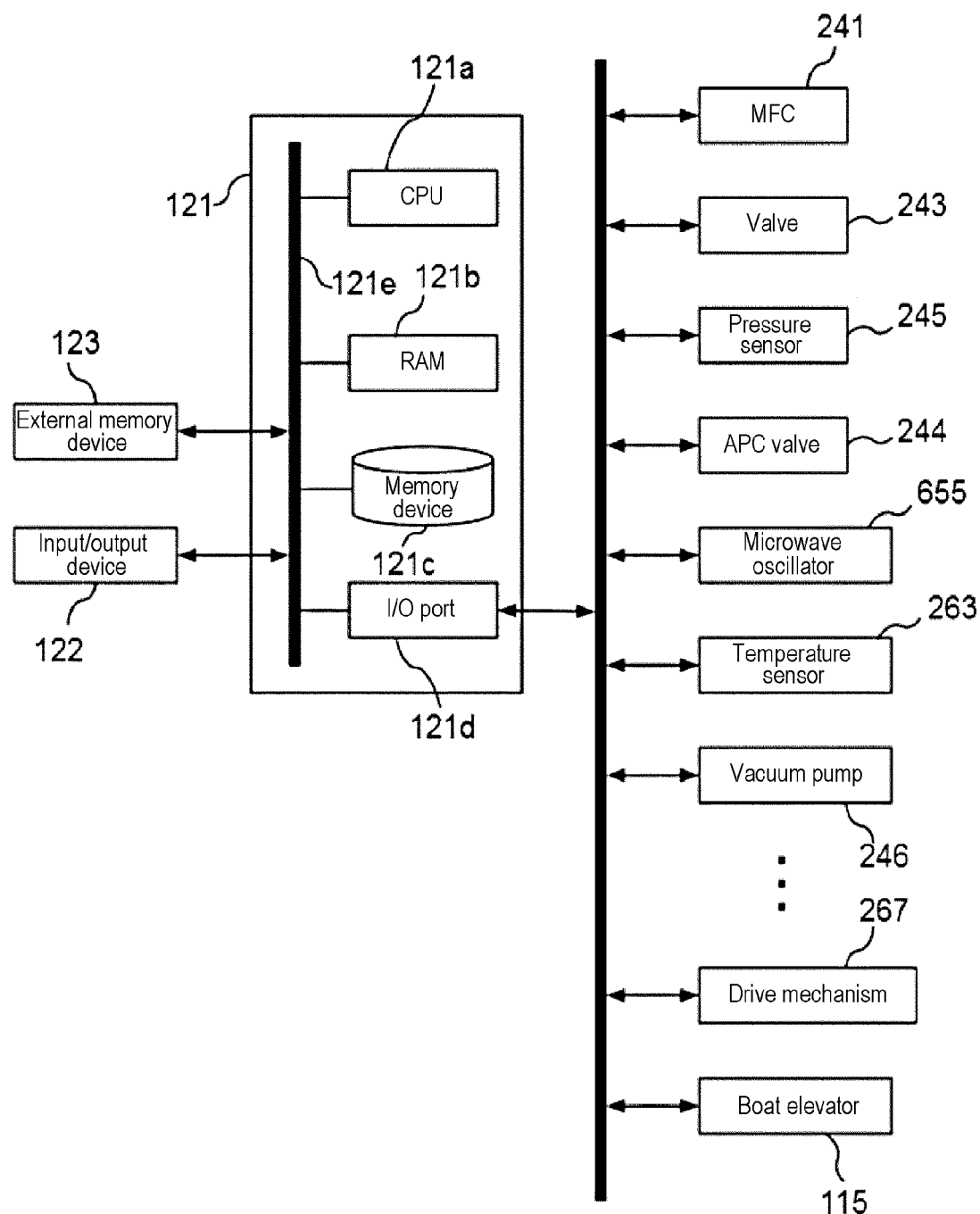
FIG. 3 is a schematic configuration diagram of a controller of a substrate processing apparatus suitably used in the present disclosure.

As shown in FIG. 3, the controller 121 as a control part (control device or control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate processing apparatus, a process recipe in which sequences and conditions of an annealing (modifying) process are written, and the like are readably stored in the memory device 121c. The process recipe functions as a program for causing the controller 121 to execute each sequence in a substrate processing process, which will be described below, to obtain a predetermined result. Hereinafter, the process recipe and the control program will be generally and simply referred to as a "program." Further, the process recipe is simply referred to as a recipe. When the term "program" is used herein, it may indicate a case of including only the process recipe, a case of including only the control program, or a case of including both the process recipe and the control program. The RAM 121b is configured as a memory area (a work area) in which a program or data read by the CPU 121a is temporarily stored.

The I/O port 121d is connected to the MFC 241, the valve 243, the pressure sensor 245, the APC valve 244, the vacuum pump 246, the temperature sensor 263, the drive mechanism 267, the microwave oscillator 655, and the like.

The CPU 121a is configured to read the control program from the memory device 121c and execute the same. The CPU 121a is also configured to read the recipe from the memory device 121c according to an input of an operation command from the input/output device 122. The CPU 121a is configured to control, according to the contents of the recipe thus read, a flow rate adjustment operation of various gases performed by the MFC 241, an opening/closing operation of the valve 243, a pressure adjustment operation performed by the APC valve 244 based on the pressure sensor 245, an activation and stoppage of the vacuum pump 246, an output adjustment operation of the microwave oscillator 655 based on the temperature sensor 263, a rotation, a rotation speed adjustment or a raising/lowering operation of the mounting stand 210 (or the boat 217) performed by the drive mechanism 267, and the like.

The controller 121 may be configured by installing, in a computer, the above-described program stored in an external memory device (e.g., a magnetic disk such as a hard disk, an optical disk such as a CD, a magneto-optical disk such as an MO, or a semiconductor memory such as a USB memory) 123. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Process

Figure 4:
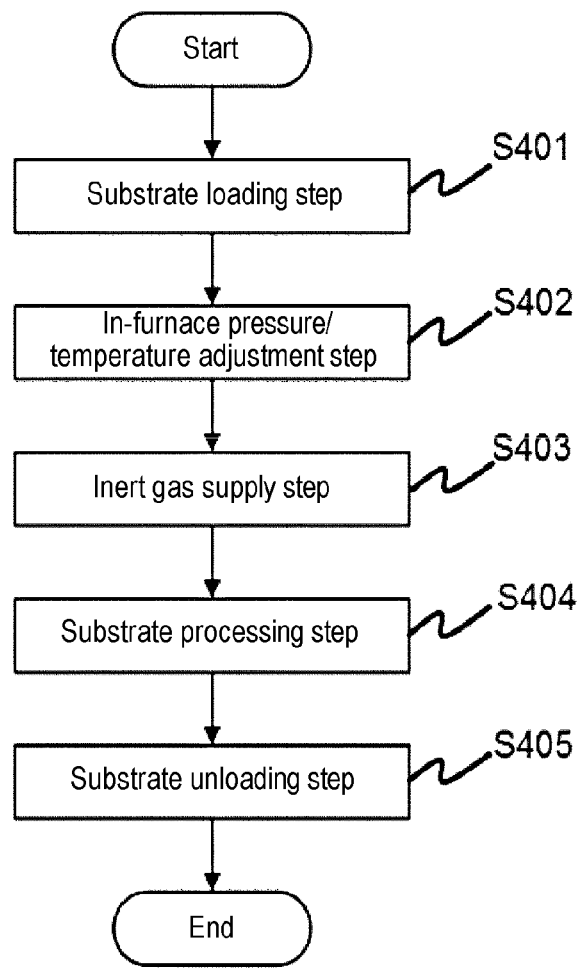
FIG. 4 is a view showing a flow of substrate processing in the present disclosure.

Next, a process of manufacturing a semiconductor device using the process furnace of the above-described substrate processing apparatus 100, for example, an example of a method of modifying (crystallizing) an amorphous silicon film as a silicon-containing film formed on a substrate will be described with reference to a processing flow shown in FIG. 4. In the following description, the operations of the respective parts constituting the substrate processing apparatus 100 are controlled by the controller 121.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." The expression "a predetermined layer is formed on a wafer" as used herein may mean that "a predetermined layer is directly formed on a surface of a wafer itself" or that "a predetermined layer is formed on a layer or the like formed on a wafer." When the term "substrate" is used herein, it may be synonymous with the term "wafer."

(Substrate Loading Step (S401))

As shown in FIG. 1, when a predetermined number of wafers 200 are transferred to the boat 217, the drive mechanism 267 raises the mounting stand 210 to load the boat 217 into the process chamber 201 inside the reaction tube 103 (boat loading) (S401).

(In-Furnace Pressure/Temperature Adjustment Step (S402))

After the loading of the boat 217 into the process chamber 201 is completed, the atmosphere in the process chamber 201 is controlled so that the pressure in the process chamber 201 becomes a predetermined pressure (for example, 10 to 102,000 Pa). Specifically, while performing evacuation by the vacuum pump 246, the valve opening degree of the pressure regulator 244 is feedback-controlled based on the pressure information detected by the pressure sensor 245. Thus, the pressure in the process chamber 201 is set to a predetermined pressure. At the same time, the electromagnetic wave supply part may be controlled to perform preheating and may be controlled to perform heating to a predetermined temperature (S402). When the temperature is raised to a predetermined substrate processing temperature by the electromagnetic wave supply part, the temperature raising may be performed by an output smaller than an output of a modifying step to be described below so that the wafer 200 is not deformed or broken in some embodiments. In the case where substrate processing is performed under an atmospheric pressure, after only the in-furnace temperature is adjusted without adjusting the in-furnace pressure, the process may be controlled so as to proceed to an inert gas supply step S403 to be described below.

(Inert Gas Supply Step (S403))

After the pressure and the temperature in the process chamber 201 are controlled to predetermined values in the in-furnace pressure/temperature adjustment step S402, the drive mechanism 267 rotates the shaft 255 and rotates the wafer 200 via the boat 217 on the mounting stand 210. At this time, an inert gas such as a nitrogen gas or the like is supplied through the gas supply pipe 232 (S403). Furthermore, at this time, the pressure in the process chamber 201 is regulated to a predetermined value falling within a range of 10 Pa to 102000 Pa, for example, 101300 Pa or more and 101650 Pa or less. The shaft 255 may be rotated during the substrate loading step S401, i.e., after the wafer 200 has been loaded into the process chamber 201.

(Modifying Step (S404))

When the interior of the process chamber 201 is maintained at a predetermined pressure, the microwave oscillator 655 supplies a microwave into the process chamber 201 via the above-described respective parts. By supplying the microwave into the process chamber 201, the wafer 200 is heated to a temperature of 100 degrees C. or more and 1000 degrees C. or less, 600 degrees C. or more and 900 degrees C. or less in some embodiments, or 800 degrees C. or more and 850 degrees C. or less in some embodiments. By performing the substrate processing at such a temperature, the substrate is processed under the temperature at which the wafer 200 efficiently absorbs the microwave. This makes it possible to increase the speed of the modifying process. In other words, if the wafer 200 is processed at a temperature lower than 100 degrees C. or higher than 1000 degrees C., the surface of the wafer 200 is degraded and becomes difficult to absorb the microwave. Therefore, it becomes difficult to heat the wafer 200. Accordingly, the substrate processing may be performed in the above-described temperature range in some embodiments.

In the present embodiment in which heating is performed by an electromagnetic wave heating method, a standing wave is generated in the process chamber 201. On the wafer 200 (also the susceptor in the case where the susceptor is placed), there are generated a locally-heated concentrated heating region (hot spot) and a remaining unheated region (non-heating region). By controlling the ON/OFF of the power supply of the electromagnetic wave supply part in order to suppress deformation of the wafer 200 (also the susceptor in the case where the susceptor is placed), it is possible to suppress generation of a hot spot on the wafer 200.

As described above, the temperature sensor 263 is a non-contact type temperature sensor. If the wafer 200 (or the susceptor in the case where the susceptor is placed) as a measurement target is deformed or broken, the position of the wafer 200 to be monitored by the temperature sensor or the measurement angle with respect to the wafer 200 is changed. Therefore, the measurement value (monitoring value) is inaccurate, and the measurement temperature is abruptly changed. In the present embodiment, the abrupt change in the measurement temperature of the radiation thermometer caused by the deformation or breakage of the measurement target is used as a trigger for turning on or off the electromagnetic wave supply part.

Specifically, an upper limit and a lower limit of a threshold temperature based on the substrate processing temperature are set in advance. The substrate processing is controlled by the controller 121 so that the substrate processing is performed at a temperature not exceeding the upper limit of the threshold temperature and not falling below the lower limit of the threshold temperature. The upper limit of the threshold temperature is a temperature higher than the substrate processing temperature and may be set to fall within the substrate processing temperature+5% in some embodiments. The lower limit of the threshold temperature is a temperature lower than the substrate processing temperature and may be set to fall within the substrate processing temperature−5% in some embodiments. For example, when the substrate processing temperature is 825 degrees C., the upper limit temperature may be set to a temperature higher than 825 degrees C. and equal to or lower than 866 degrees C. with having an upper limit of about 866 degrees C. which is +5% of 825 degrees C., and the lower limit temperature may be set to a temperature lower than 825 degrees C. and equal to or higher than 783 degrees C. with having a lower limit of about 783 degrees C. which is −5% of 825 degrees C. If the setting criterion for the upper limit temperature and the lower limit temperature is set higher than +5% of the substrate processing temperature or lower than −5% of the substrate processing temperature, the deformation amount of the wafer 200 becomes large. In the worst case, there is a possibility that the wafer 200 is broken.

Figure 5:
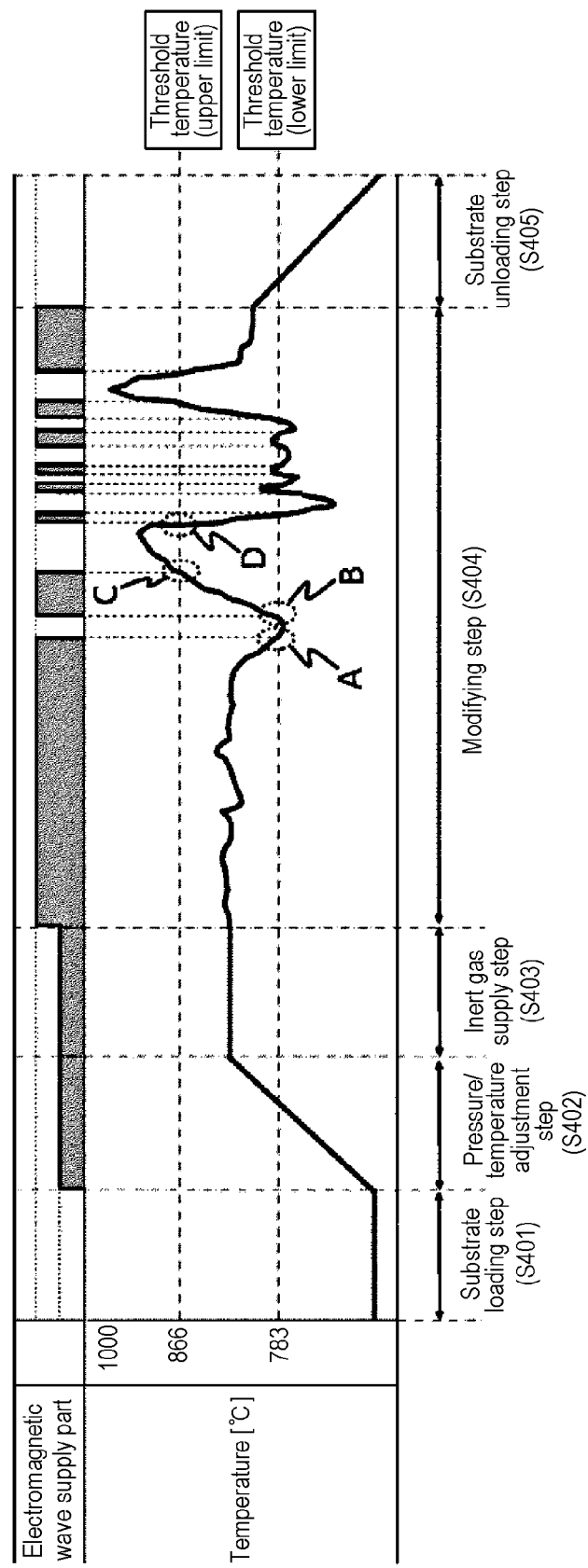
FIG. 5 is a view showing a relationship between a change in substrate processing temperature and an electromagnetic wave supply part in the present disclosure.

In the case where a modifying step is performed at the upper limit temperature and the lower limit temperature described above, if it is detected that the temperature of the wafer 200 measured by the temperature sensor 263 becomes lower than 783 degrees C. which is the lower limit temperature at timing A as shown in FIG. 5, the controller 121 turns off the electromagnetic wave supply part, i.e., the microwave oscillator 655. The microwave oscillator 655 is turned off to stop supplying the microwave and awaits until the temperature of the wafer 200 rises to a temperature at which the substrate can be processed. Thereafter, the controller 121 turns on the microwave oscillator 655 and starts heating the wafer 200 again at timing B when the temperature of the wafer 200 becomes 783 degrees C. which is the lower limit temperature at which the substrate can be processed. As described above, in the present disclosure, if the measured temperature deviates from a predetermined range as at the aforementioned timing A, it is determined that the temperature sensor 263 cannot accurately measure the temperature, i.e., that the wafer 200 is deformed. Therefore, when the microwave oscillator 655 is turned off as at the timing A, the thermal energy of the heating concentrated portion (hot spot portion) generated in the wafer 200 by the microwave is thermally conducted in the plane of the wafer 200, whereby the thermal energy spreads in the plane of the wafer 200 so that the wafer 200 has a uniform in-plane temperature. Since the wafer 200 has a uniform temperature due to thermal conduction, the temperature difference in the plane of the wafer 200 becomes small, and the deformation amount of the wafer 200 also becomes small. As the deformation amount of the wafer 200 becomes small, the temperature sensor 263 can accurately measure the temperature. As a result, the temperature returns to fall within a temperature range which is the original substrate processing temperature zone. Even when the power supply of the microwave oscillator 655 is turned off, the measured temperature of the wafer 200 rises. This phenomenon similarly occurs at timing C described later. Thus, the same control can be performed for each of the upper limit temperature and the lower limit temperature.

Even at timing C at which the temperature of the wafer 200 becomes higher than the upper limit temperature, the controller 121 operates in the same manner as at the timing A for the lower limit temperature. That is, when the temperature of the wafer 200 measured by the temperature sensor 263 becomes higher than the upper limit temperature of 866 degrees C., the controller 121 turns off the microwave oscillator 655. By turning off the microwave oscillator 655 and stopping the supply of the microwave, the heating of the wafer 200 is stopped to wait until the temperature of the wafer 200 falls to become equal to or lower than the upper limit temperature, i.e., 866 degrees C. at which the substrate can be processed. Thereafter, at timing D when the temperature of the wafer 200 becomes a temperature at which the substrate can be processed, the controller 121 turns on the microwave oscillator 655 to start heating the wafer 200 again.

By controlling the microwave oscillator 655 as described above, the wafer 200 is heated to modify (crystallize) the amorphous silicon film formed on the surface of the wafer 200 into a polysilicon film. That is, it becomes possible to uniformly modify the wafer 200. In the case where the measured temperature of the wafer 200 becomes high or low beyond the above-mentioned threshold value, the output of the microwave oscillator 655 may be controlled to be decreased without turning off the microwave oscillator 655, whereby the temperature of the wafer 200 may be set to fall within a predetermined range. In this case, when the temperature of the wafer 200 returns to the temperature falling within the predetermined range, the output of the microwave oscillator 655 is controlled to be increased.

When a preset processing time elapses, the rotation of the boat 217, the supply of the gas, the supply of the microwave and the exhaust through the exhaust pipe are stopped.
(Substrate Unloading Step (S405))

After restoring the pressure in the process chamber 201 to the atmospheric pressure, the drive mechanism 267 lowers the mounting stand 210 to open a furnace port and unloads the boat 217 to the transfer space 203 (boat unloading). Thereafter, the wafer 200 placed on the boat is carried out to the transfer chamber located outside the transfer space 23 (S405).

By repeating the above operations, the wafer 200 is modified.

(3) Effects of the Present Embodiment

According to the present disclosure, one or more of the following effects may be obtained.

(a) By setting the upper limit temperature and the lower limit temperature based on the substrate processing temperature and controlling the heating device, it is possible to prevent the wafer from being deformed or damaged during substrate processing.

(b) By setting the upper limit temperature and the lower limit temperature to be higher or lower than the substrate processing temperature in the range of higher than 0% to 5% or less of the substrate processing temperature, it is possible to allow the wafer temporarily deformed by heating to restore its original shape after the substrate processing, and it is possible to suppress the deformation or breakage of the wafer.

(c) After lowering the output of the heating device by the upper limit temperature or the lower limit temperature or after turning off the power supply of the heating device, if the wafer temperature, i.e., the temperature data is lower than the upper limit temperature or higher than the lower limit temperature, the output of the heating device is increased or the power supply of the heating device is turned on. This makes it possible to efficiently heat the wafer and to efficiently perform the wafer processing.

(4) Modification of the First Embodiment

The substrate processing apparatus according to the present embodiment is not limited to the aforementioned embodiment but may be modified as in the following modification.

Modification 1

In the first embodiment, the upper limit temperature and the lower limit temperature as threshold values are set based on the substrate processing temperature. However, the present disclosure is not limited thereto. The heating device may be controlled based on a temperature change rate per unit time. With such a configuration, deformation or breakage of the wafer 200 can be suppressed more accurately compared to the case where the upper limit temperature and the lower limit temperature are set. This makes it possible to efficiently perform the wafer processing.

Second Embodiment of the Present Disclosure

Figure 6:
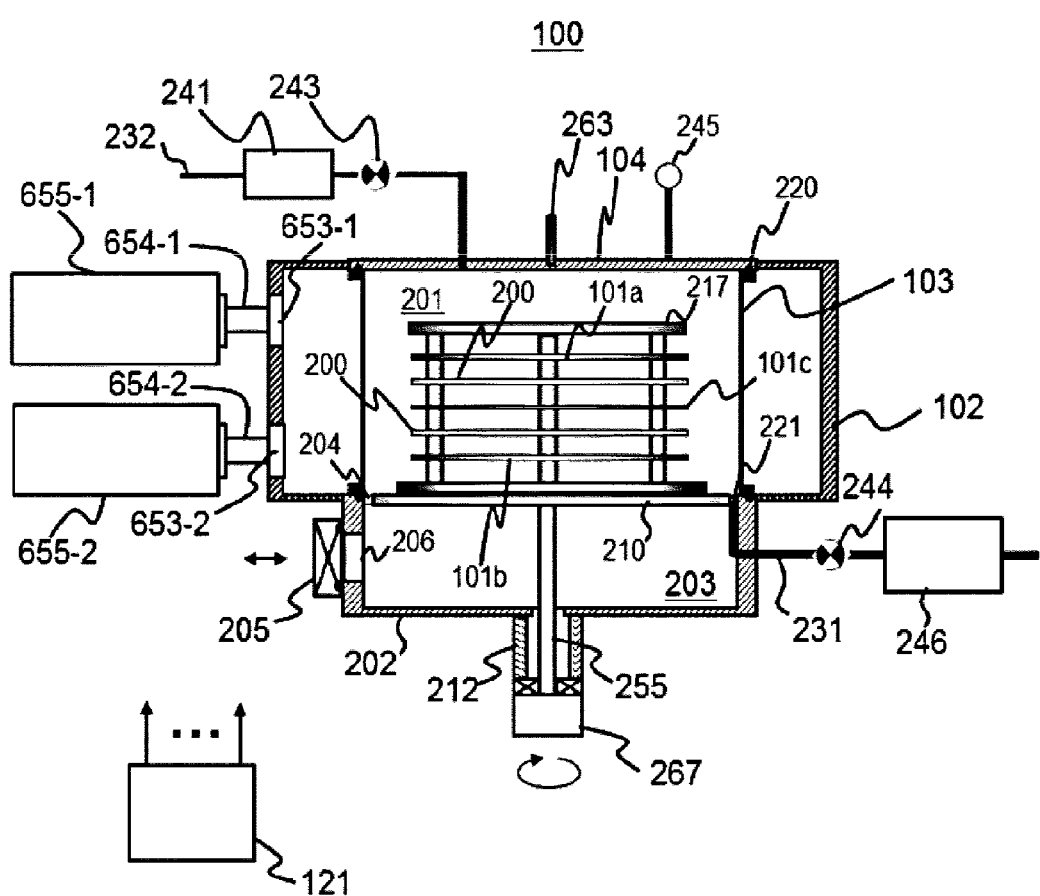
FIG. 6 is a schematic configuration diagram of a vertical process furnace of a substrate processing apparatus suitably used in a second embodiment of the present disclosure, and the process furnace portion is shown in a vertical sectional view.

As shown in FIG. 6, in the second embodiment, the substrate processing apparatus is configured as a so-called vertical batch type substrate processing apparatus capable of holding a plurality of substrates in multiple stages in a vertical direction. In such a configuration, quartz plates 101c serving as heat insulating plates are installed between the wafers 200 held in multiple stages in the vertical direction. With such a configuration, it is possible to process a plurality of substrates and to improve a substrate processing efficiency. At this time, instead of placing the quartz plates 101c as the heat insulating plates, susceptors (not shown) as heating elements to be dielectrically heated by an electromagnetic wave may be placed or both the heat insulating plates and the heating elements may be placed. Further, the quartz plates 101c may not be placed between the wafers 200. Although the number of the wafers 200 held in the boat 217 is two in the embodiment shown in FIG. 6, the present disclosure is not limited thereto. For example, a large number of wafers 200 such as 25 wafers or 50 wafers may be processed.

While the present disclosure has been described with reference to the embodiments, the respective embodiments and modifications described above may be used in combination as appropriate and the effects thereof may also be obtained.

For example, in each of the embodiments described above, there has been described the process of modifying an amorphous silicon film as a film containing silicon as a main component into a polysilicon film. However, the present disclosure is not limited thereto. The film formed on the surface of the wafer 200 may be modified by supplying a gas containing at least one of oxygen (O), nitrogen (N), carbon C) and hydrogen (H). For example, in the case where a hafnium oxide film ($Hf_xO_y$ film) as a high dielectric film is formed on the wafer 200, a microwave may be supplied to heat the hafnium oxide film while supplying a gas containing oxygen. This makes it possible to supplement the defective oxygen in the hafnium oxide film and to improve the characteristics of the high dielectric film.

Although the hafnium oxide film is shown herein, the present disclosure is not limited thereto. In some embodiments, the present disclosure may be applied to a case of modifying an oxide film containing a metal element including at least one of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like, i.e., a metal-based oxide film. That is, the aforementioned film-forming sequence may be applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film or a WO film, which is formed on the wafer 200 in some embodiments.

In addition to the high dielectric film, a film doped with impurities and containing silicon as a main component may be heated. Examples of the film containing silicon as a main component include Si-based oxide films such as a silicon nitride film (SiN film), a silicon oxide film (SiO film), a silicon oxycarbide film (SiOC film), a silicon oxycarbonitride film (SiOCN film), a silicon oxynitride film (SiON film) or the like. Examples of the impurities include at least one of bromine (B), carbon (C), nitrogen (N), aluminum (Al), phosphorus (P), gallium (Ga), arsenic (As) and the like.

Further, the film may be a resist film based on at least one of a polymethyl methacrylate (PMMA) resin, an epoxy resin, a novolac resin, a polyvinyl phenyl resin and the like.

Although a process of manufacturing a semiconductor device has been described above, the present disclosure is not limited thereto but may be applied to a substrate processing technique such as a patterning process of a liquid crystal panel manufacturing process, a patterning process of a solar cell manufacturing process, a patterning process of a power device manufacturing process or the like.

As described above, according to the present disclosure, it is possible to provide an electromagnetic wave heat treatment technique capable of suppressing deformation or breakage of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process chamber in which at least one substrate is processed;
   at least one heating device configured to heat the at least one substrate using an electromagnetic wave;
   a non-contact type temperature measurement device configured to measure a temperature of the at least one substrate; and
   a controller configured to perform control so as to acquire temperature data measured by the temperature measurement device, compare the measured temperature from the temperature data with a preset upper limit temperature and a preset lower limit temperature, lower an output of the at least one heating device or turn off a power supply of the at least one heating device when the measured temperature from the temperature data is higher than the upper limit temperature, and lower an output of the at least one heating device or turn off a power supply of the at least one heating device when the measured temperature from the temperature data is lower than the lower limit temperature.

2. The apparatus of claim 1, wherein the upper limit temperature is higher than a substrate processing temperature for processing the substrate and is set to fall within a range from the substrate processing temperature to a temperature of +5% of the substrate processing temperature.

3. The apparatus of claim 1, wherein the lower limit temperature is lower than a substrate processing temperature for processing the substrate and is set to fall within a range from the substrate processing temperature to a temperature of −5% of the substrate processing temperature.

4. The apparatus of claim 1, wherein the controller is further configured to perform control so as to increase the output of the at least one heating device or so as to turn on the power supply of the at least one heating device when the measured temperature from the temperature data becomes lower than the upper limit temperature or higher than the lower limit temperature after lowering the output of the at least one heating device or turning off the power supply of the at least one heating device.

5. The apparatus of claim 1, wherein the controller is configured to perform control so as to lower the output of the at least one heating device or so as to turn off the power supply of the at least one heating device when the measured temperature from the temperature data becomes lower than the lower limit temperature after the measured temperature from the temperature data falls within a range of the upper limit temperature and the lower limit temperature.

6. The apparatus of claim 5, wherein the controller is configured to perform control so as to keep the output of the at least one heating device lowered or so as to keep the power supply of the at least one heating device turned off until the measured temperature from the temperature data becomes equal to the lower limit temperature after lowering the output of the at least one heating device or turning off the power supply of the at least one heating device.

7. The apparatus of claim 6, wherein the controller is configured to perform control so as to increase the output of the at least one heating device or so as to turn on the power supply of the at least one heating device when the measured temperature from the temperature data becomes equal to the lower limit temperature.

8. The apparatus of claim 2, wherein the substrate processing temperature is 100 degrees C. or higher and 1000 degrees C. or lower.

9. The apparatus of claim 1, wherein the temperature measurement device is a radiation thermometer.

10. The apparatus of claim 1, wherein the at least one heating device includes a plurality of heating devices installed on a side wall of the process chamber.

11. The apparatus of claim 1, wherein the at least one substrate includes a plurality of substrates, and
   wherein the process chamber is configured to process the plurality of substrates held in multiple stages in a vertical direction.

* * * * *